(12) United States Patent
Bodnar et al.

(10) Patent No.: US 11,711,892 B2
(45) Date of Patent: Jul. 25, 2023

(54) METHOD OF MANUFACTURE AND USE OF A FLEXIBLE COMPUTERIZED SENSING DEVICE

(71) Applicants: Eric Oleg Bodnar, San Francisco, CA (US); Jacob Van Reenen Pretorius, Austin, TX (US)

(72) Inventors: Eric Oleg Bodnar, San Francisco, CA (US); Jacob Van Reenen Pretorius, Austin, TX (US)

(73) Assignee: Velvetwire LLC, Santa Cruz, CA (US)

( * ) Notice: Subject to any disclaimer, the term of this patent is extended or adjusted under 35 U.S.C. 154(b) by 919 days.

(21) Appl. No.: 16/512,314

(22) Filed: Jul. 15, 2019

(65) Prior Publication Data
US 2021/0020824 A1   Jan. 21, 2021

(51) Int. Cl.
| | |
|---|---|
| *H05K 1/14* | (2006.01) |
| *H10N 30/87* | (2023.01) |
| *H10N 30/00* | (2023.01) |
| *H10N 30/02* | (2023.01) |
| *G01D 11/24* | (2006.01) |

(52) U.S. Cl.
CPC .............. *H05K 1/147* (2013.01); *H10N 30/00* (2023.02); *H10N 30/02* (2023.02); *H10N 30/87* (2023.02); *G01D 11/245* (2013.01)

(58) Field of Classification Search
None
See application file for complete search history.

(56) References Cited

U.S. PATENT DOCUMENTS

| | | | |
|---|---|---|---|
| 4,429,580 A | 2/1984 | Testa et al. | |
| 4,849,668 A | 7/1989 | Crawley et al. | |
| 5,099,702 A | 3/1992 | French | |
| 5,296,651 A * | 3/1994 | Gurrie | H05K 1/118 |
| | | | 174/250 |
| 5,723,792 A | 3/1998 | Miyazaki | |
| 5,792,058 A | 8/1998 | Lee et al. | |
| 5,988,646 A | 11/1999 | Fair | |
| 6,109,115 A | 8/2000 | Miyazaki | |
| 6,191,519 B1 | 2/2001 | Nye et al. | |
| 6,192,759 B1 | 2/2001 | Schoess | |
| 6,196,932 B1 | 3/2001 | Marsh et al. | |
| 6,252,334 B1 | 6/2001 | Nye et al. | |
| 6,370,964 B1 | 4/2002 | Chang et al. | |
| 6,404,107 B1 | 6/2002 | Lazarus et al. | |

(Continued)

FOREIGN PATENT DOCUMENTS

| | | | |
|---|---|---|---|
| AU | 697494 B2 | 10/1998 | |
| CN | 102822960 B * | 6/2015 | .............. H01L 24/29 |

(Continued)

OTHER PUBLICATIONS

International Search Report and Written Opinion, PCT App. No. PCT/US2020/070269, dated Oct. 7, 2020, 12 pages.

*Primary Examiner* — Scott B Geyer
(74) *Attorney, Agent, or Firm* — Nicholson De Vos Webster & Elliott LLP; Judith Szepesi

(57) ABSTRACT

A thin, flexible computerized sensing platform which can be affixed to a structure to be sensed, which has excellent mechanical coupling between the sensors and the object to be sensed, which can be self-powered and rechargeable, and which can be environmentally sealed, and a method for assembling and utilizing the same.

21 Claims, 11 Drawing Sheets

(56) References Cited

U.S. PATENT DOCUMENTS

| | | | |
|---|---|---|---|
| 6,529,127 B2 | 3/2003 | Townsend et al. | |
| 6,625,569 B2 | 9/2003 | James et al. | |
| 6,694,548 B2 | 2/2004 | Foster et al. | |
| 6,781,285 B1 | 8/2004 | Lazarus et al. | |
| 6,802,216 B2 | 10/2004 | Schoor et al. | |
| 7,193,720 B2 | 3/2007 | Gatt | |
| 8,994,528 B2 | 3/2015 | Celik-Butler et al. | |
| 9,798,902 B2 | 10/2017 | Ludlow et al. | |
| 2005/0121796 A1* | 6/2005 | Park | H01L 23/4985 257/773 |
| 2006/0083411 A1 | 4/2006 | Benkley | |
| 2006/0220657 A1* | 10/2006 | Mitchell | B60N 2/002 324/609 |
| 2007/0105664 A1 | 5/2007 | Scheinert et al. | |
| 2008/0191174 A1* | 8/2008 | Ehrensvard | H01R 4/04 252/500 |
| 2009/0190319 A1* | 7/2009 | Hatakeyama | H01L 25/0657 361/803 |
| 2009/0195517 A1 | 8/2009 | Duheille et al. | |
| 2009/0233729 A1 | 9/2009 | Chiang et al. | |
| 2011/0304497 A1 | 12/2011 | Molyneux et al. | |
| 2012/0029843 A1 | 2/2012 | Byreddy et al. | |
| 2012/0170231 A1* | 7/2012 | Lee | H05K 1/145 29/831 |
| 2013/0010405 A1 | 1/2013 | Rothkopf et al. | |
| 2014/0055974 A1* | 2/2014 | Hansen | H05K 1/148 361/804 |
| 2014/0083206 A1* | 3/2014 | Pagani | H05K 1/0278 156/227 |
| 2014/0276504 A1 | 9/2014 | Heil et al. | |
| 2014/0305204 A1 | 10/2014 | Hong et al. | |
| 2014/0309059 A1 | 10/2014 | Minch | |
| 2015/0029341 A1 | 1/2015 | Sinha | |
| 2015/0051009 A1 | 2/2015 | Davenport et al. | |
| 2015/0054632 A1 | 2/2015 | Ezra | |
| 2015/0057112 A1 | 2/2015 | Sak et al. | |
| 2015/0192482 A1 | 7/2015 | Araki et al. | |
| 2015/0271415 A1 | 9/2015 | Uemura et al. | |
| 2015/0296622 A1 | 10/2015 | Jiang et al. | |
| 2016/0073961 A1 | 3/2016 | Soh et al. | |
| 2016/0149292 A1* | 5/2016 | Ganton | G06K 19/0723 29/601 |
| 2016/0352031 A1* | 12/2016 | Ito | H05K 1/147 |
| 2017/0223846 A1* | 8/2017 | Elolampi | H05K 3/32 |
| 2017/0231098 A1* | 8/2017 | Zluc | H05K 3/22 |
| 2017/0237430 A1* | 8/2017 | Stone | B42D 15/00 200/600 |
| 2018/0146551 A1* | 5/2018 | Kida | H05K 3/361 |
| 2018/0314368 A1* | 11/2018 | Isaacson | H05K 5/0017 |
| 2018/0321061 A1* | 11/2018 | Rissing | H05K 1/181 |
| 2019/0059164 A1* | 2/2019 | Hassemer | G06F 1/1637 |
| 2019/0082536 A1* | 3/2019 | Park | G06F 1/263 |
| 2019/0104616 A1* | 4/2019 | Marsh | B81B 3/0021 |

FOREIGN PATENT DOCUMENTS

| | | | | |
|---|---|---|---|---|
| CN | 102881710 B | * | 8/2017 | G06F 3/0412 |
| EP | 1944095 A2 | | 7/2008 | |
| GB | 2261290 A | * | 5/1993 | A61B 5/0008 |
| GB | 2531339 A | * | 4/2016 | B42D 15/022 |
| WO | WO-2006094513 A2 | * | 9/2006 | A61B 5/0002 |
| WO | 2009/094728 A1 | | 8/2009 | |
| WO | 2011110806 A1 | | 9/2011 | |
| WO | 2016054372 A1 | | 4/2016 | |
| WO | WO-2019155732 A1 | * | 8/2019 | G01D 21/00 |

* cited by examiner

METHOD OF MANUFACTURE AND USE OF A FLEXIBLE COMPUTERIZED SENSING DEVICE

FIELD OF THE INVENTION

The present application is related to sensors, and more particularly to a flexible sensing device.

BACKGROUND

Current solutions for attaching sensors to a device to be sensed, addressing tight mechanical coupling, involve affixing a rigid sensing device to a rigid mechanical structure to be sensed, usually with threaded fasteners. Drilling, tapping and threading a structure are non-ideal invasive operations, especially in situations where such operations can compromise the structure itself, and in some cases void the warrantee. Furthermore, rigid sensing mechanisms do not lend themselves to measuring dynamic strain, which can be more informative than simple vibration. Finally, the current state of rigid MEMS based sensing solutions struggle to achieve measurements at frequencies above a few Kilohertz, or consume significant power while doing so, making them unusable for high-frequency event analysis.

LIST OF FIGURES

The present invention is illustrated by way of example, and not by way of limitation, in the figures of the accompanying drawings and in which like reference numerals refer to similar elements and in which.

DETAILED DESCRIPTION

Figure 1:
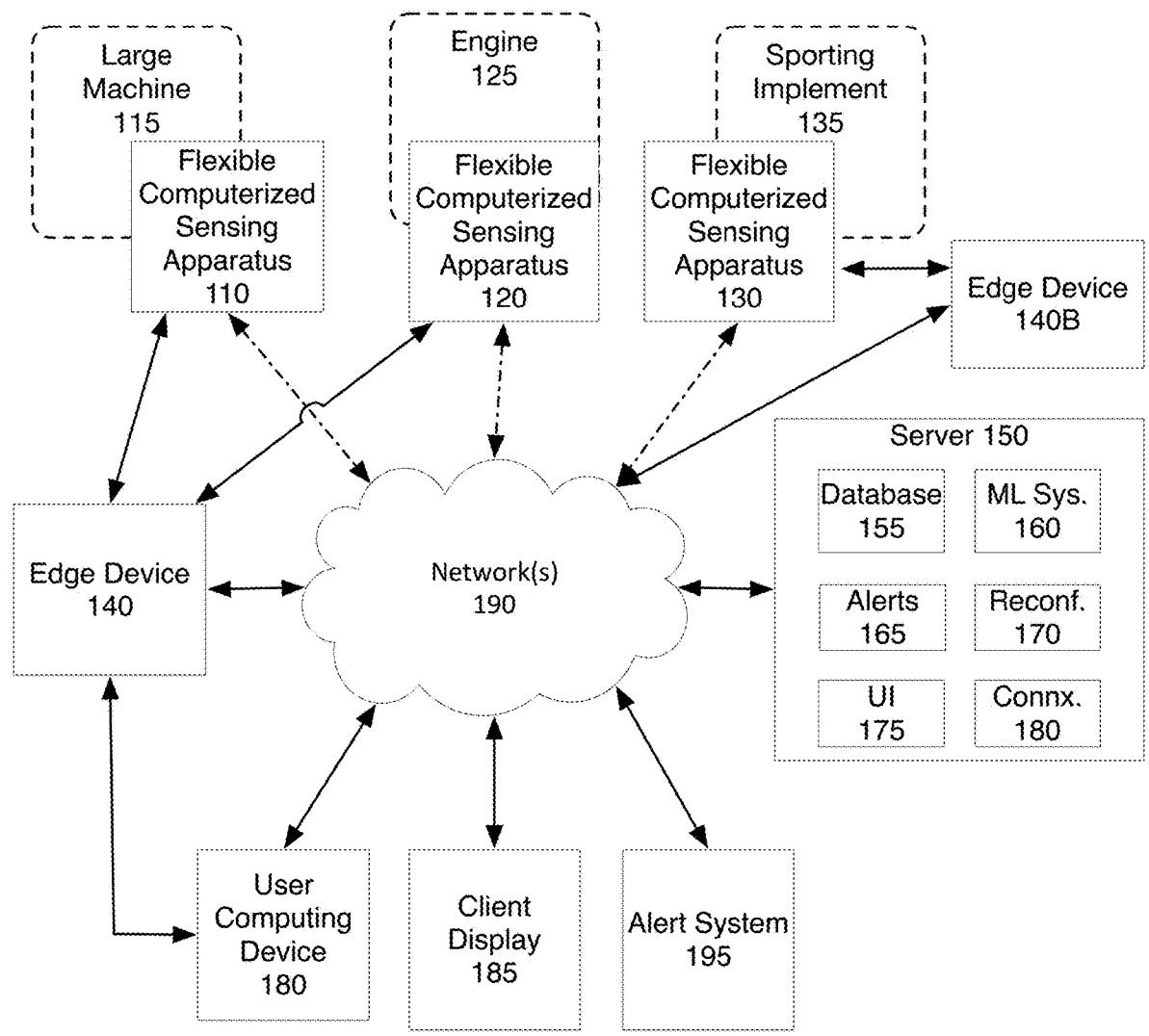
FIG. 1 is a System Diagram of one embodiment of an Intelligent Sensor Platform and Architecture and the System in which it can be used.

Sensing vibration, shock, audio and dynamic strain in structures requires tight mechanical coupling between the surface of the structure to be sensed and the sensors themselves. In many cases, the structure to be sensed does not have a perfectly flat surface at the desired location for sensing. Further, in-situ analysis and real time decision making based on mechanical phenomena requires both sensing and computation. Additionally, protection from the environment, chemicals and other agents as well as the ability to operate independently of external power are often desired.

A non-invasive, thin, flexible, computerized, sealed and self-contained sensing apparatus which can achieve good mechanical coupling to the structure to be sensed, simply by adhering it to the structure, and which is capable of measuring dynamic strain and vibration across a broad range of frequencies would address these issues.

Traditional MEMS based sensors, while commonplace, are limited in their applicability for such uses. To start with, they are rigid in construction, making it difficult to conform them to a non-flat surface. Furthermore, the limited vibration range of the such prior art sensors causes them to saturate in response to all but the lightest impacts, and the limited frequency range makes it difficult to sense high-frequency vibrations. Finally, dynamic strain, very useful in structural analysis, is difficult to ascertain with prior-art MEMS based sensors.

Piezo-electric sensors, on the other hand, are ideal for measuring vibration, shock, dynamic strain, and even audio signals. The crystalline material in these sensors exhibits the piezo-electric effect in response to dynamic mechanical disturbance which can be measured with electronic circuitry. Further enhancing the applicability of such sensors are their relative immunity to electrical field disturbances.

Piezo-electric material has a modulus of elasticity similar to that of various metals. Traditionally, the material is applied to or sealed within a metallic or ceramic structure to create a durable sensing device. Unfortunately, the resulting sensing mechanism is both bulky and stiff.

Polyvinylidene fluoride (PVDF) piezo-electric thin film sensors are an alternative to traditional piezo-electric sensing mechanisms. These are constructed by applying a very thin layer of piezo-electric material to either side of an insulating carrier material, forming a sheet of very thin and flexible piezo-sensitive material. This type of sensor is mechanically ideal for constructing the type of thin and flexible computerized sensing apparatus desired, one which can both adhere to and conform to the surface of the structure to be sensed.

Unfortunately, the thinness and mechanical flexibility of PVDF sensors comes with a set of disadvantages. Electrical contact must be made with the piezo-electric material both on the underside of the insulating carrier as well on top side, which is a challenge for incorporation with surface mounted electrical components needed to read the sensor output. Further complicating matters is the fact that the PVDF material cannot withstand high temperatures, making traditional circuit bonding techniques, such as solder reflow, impossible to use.

Traditional solutions to the electrical contact problem for PVDF sensors typically involve mechanical processes which penetrate the sensor layers to make electrical contact, such as rivets or crimp connectors. While effective and requiring no heat, these processes introduce both thickness and mechanical rigidity not desired in the apparatus.

A method for constructing a flexible computerized sensing apparatus which incorporates thin flexible sensors such as PVDF piezo-electric sensors, the apparatus itself, and a method of using it are described herein. The output of such an apparatus may be used in various ways, some of which are described. However, one of skill in the art would understand the logical extensions from the described uses.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

FIG. 1 illustrates a high level block diagram, showing an exemplary flexible computerized sensing apparatus (FCSA or SA). The SA 110, 120, 130 is designed to be attached to a structure. In one embodiment, the SA is attached to a structure non-invasively. The flexibility of the SA enables it to be attached to non-flat surfaces, and for it to conform to the surface of the structure, so that the sensors are in full contact with the structure. In one embodiment, the mechanically flexible nature of the SA enables it to detect dynamic strain and flexion data, which is not possible with the prior-art rigid sensors. In one embodiment, the SA has a flexible, affixable sensing portion and a more rigid portion containing the surface mounted electronics.

For example, an SA 110 may be attached to machinery 115 to detect vibrations and/or dynamic strain, an SA may be attached to an engine 125, an SA 130 may be attached to sporting equipment 135, or to any other type of structure which would benefit from data about its movements and/or flexion. In one embodiment, a single structure may have multiple coupled SAs. In one embodiment, the SA 110, 120, 130 sends sensor data to another device for processing. The other device may be an edge device 140 and/or a server 150. In one embodiment, the SA 110, 120, 130 may pre-process the data prior to sending it to another device.

As described below, in one embodiment the SA includes a micro-controller unit, which may be used for data processing. In one embodiment, the SA 110, 120, 130 may be capable of performing a number of signal processing functions on the sensor data, including integration, filtration, root mean square (RMS), even transformation from time to frequency domain (i.e. FFT). In one embodiment, the SA may be capable of identifying features (e.g. identifying peaks in the signal or changes in RMS) in the sensor data. In one embodiment, the micro-controller in the SA may be used to make real time decisions based on the data rather than have decisions deferred to a mobile device, edge device, or the server. For example, in one embodiment, when the SA 130 is attached to sporting equipment 135, the signals from the sensor are locally analyzed and determine a quality of the shot, a power of the swing, etc.

Each SA 110, 120, 130 can communicate with an edge device 140, in one embodiment. In one embodiment, the SA communicates with the edge device 140 via a local area network (LAN), or personal area network (PAN). In one embodiment, the SA communicates with the edge device 140 via Bluetooth Low Energy (BLE). Other wireless communication methods may be used. In one embodiment, wired communication methods may also be used, in which a cable is attached to the SA.

An edge device 140, in one embodiment, may receive data from any number of SAs. The edge device 140, in one embodiment, may be a special purpose device designed to receive a wireless signal from an SA, optionally provide processing, and/or transmit the data on to a server or other device to process the data and make determinations. The edge device, in one embodiment, may be a mobile telephone including an application to interface with one or more SAs. The edge device 140, in one embodiment, may be any computing device with access to a network. In one embodiment, the edge device 140 may be reached directly via a radio signal by the SA. In another embodiment, there may not be an edge device 140 and the SA may send a signal directly through a network 190, such as the Internet or cellular network, via a wireless router or cellular network chip in the SA to server 150.

In one embodiment, the edge device 140 and SA 110, 120, 130 may process the data locally, to provide immediate alerts or actions, if needed. In one embodiment, the edge device 140 may process the data alone. In another embodiment, the edge device 140 may provide the data to a server 150 for processing. The processing may be split between the SA, edge device, and server in various ways. The below description assumes that the analysis is performed by the server. However, it should be understood that the operations described below with respect to the server 150 may be performed by the server, edge device, and/or sensing apparatus, or a combination of those devices, and it does not matter which device(s) perform the analysis.

Server 150 receives data from the SAs 110, 120, 130 either directly or through edge device(s) 140, and processes the data to provide useful information to users. In one embodiment, the processed data from one or more SAs may be made available to the user via a web interface and/or application on user computing device 180. In one embodiment, the processed data may be sent via a network to a client display 185. The client display 185 may be a mobile device, a web-enabled computing device of any type. In one embodiment, the user computing device 180/client display 185 may be the same device as the edge device 140, such as a user's mobile device. In one embodiment, an alert system 195 may also be associated with the SA 110, 120, 130. The alert system may include local alerts, if the analysis indicates that there is a problem with the system being monitored. The alert system 195 may be a special purpose device or part of the user computing device 180, client display 185, and/or edge device 140. In one embodiment, the alert system 195 is incorporated into SA 110 itself. In one embodiment, the server 150 communicates the alert status back to the SA via edge device 140.

In one embodiment, data from the SA 110, 120, 130 may also be displayed locally via an edge device 140 or client display 185. The client display in one embodiment receives data from the server 150, the edge device 140, and/or directly from the SA. For example, in one embodiment, edge device 140 may be a local computer system which provides a display where the output of the SA may be shown.

The SA may be attached to critical infrastructure. For example, sensor data may be used to identify bearing failure, shaft failure, mis-alignment, and/or wear. In one embodiment, sensor data may be used to determine whether the machinery to which the SA is attached is operating within norms. In one embodiment, an alert may be sent when the machinery is outside the operating norms. In one embodiment, the system may detect onset of cavitation in pumps, de-lamination of the structure, or other damage. In one embodiment, SA may be attached to sensitive equipment, to track how it is treated, e.g. to track for tipping, bumps, excess temperature, excess humidity, etc. In one embodiment, SA may be attached to moving objects, such as blades on a wind turbine or fan. In one embodiment, the SA may be attached to sports equipment to sense the quality, location and severity of impacts, whether for bat-ball sports equipment to characterize hits or for protective sports equipment, such as helmets, for detection of potential injury.

Server 150 in one embodiment, receives data from edge device 140 and/or SAs 110, 120, 130 via network connection 180. In one embodiment, the server 150 can also send data to user computing device 180, client display 185, and/or alert system 195 via connection 180.

The server 150, in one embodiment, includes a database 155 or other memory to store data from the flexible computerized sensing apparatuses. In one embodiment, the server 150 collects data over time, from a plurality of SAs. Machine learning system 160, implemented by a processor, utilizes the data over time to determine the "operating norms" of a device, for example. In one embodiment, the system may be set up to send out alerts when the device is operating outside its operating norms. Alerts may also be set out if the sensor data indicates some current or incipient problem.

When the system determines that an alert should be sent, in one embodiment, an alert is sent out by alert system 165. In one embodiment, alert system 165 determines which type of alert to send out, based on the data from the machine learning system 160. The alert may be sent to alert system 195 on the client site, the SA 110, 120, 1130, edge device 140, and/or user devices 180, 185, 195. The alert may be displayed via a sound, light, or other mechanism. In one embodiment, the alert system 165 may automatically turn off the machines 115, 125, 135 deemed to have an issue. Other ways of addressing the alert may be used.

In one embodiment, server 150 provides a web interface, or other user interface 175 which may be accessed by user devices 180, 185. In one embodiment, the user interface 175 creates a "dashboard" type display for the user, showing the status of the various machines 115, 125, 135 based on the analysis from their respective SA 110, 120, 130. Note that although in this illustration shows a single SA 110, 120, 130 attached to each structure 115, 125, 135, multiple SAs may be associated with any structure. In one embodiment, each SA has a unique identifier, and is associated with the structure and optionally the location on the structure when it is initiated.

The use of the sensor system enables an "Internet of Things" (IoT) connectivity for devices which otherwise do not have the ability to supply data about their status. This also permits the retrofitting of existing infrastructure with IoT connectivity. The ability to collect real-time sensor data from a large range of structures is beneficial in many ways. For example, a large machine system may be monitored to detect changes in the mechanical characteristics, based on the detected sensor data. This may be used for example to monitor for degradation of a system over time.

Figure 2:
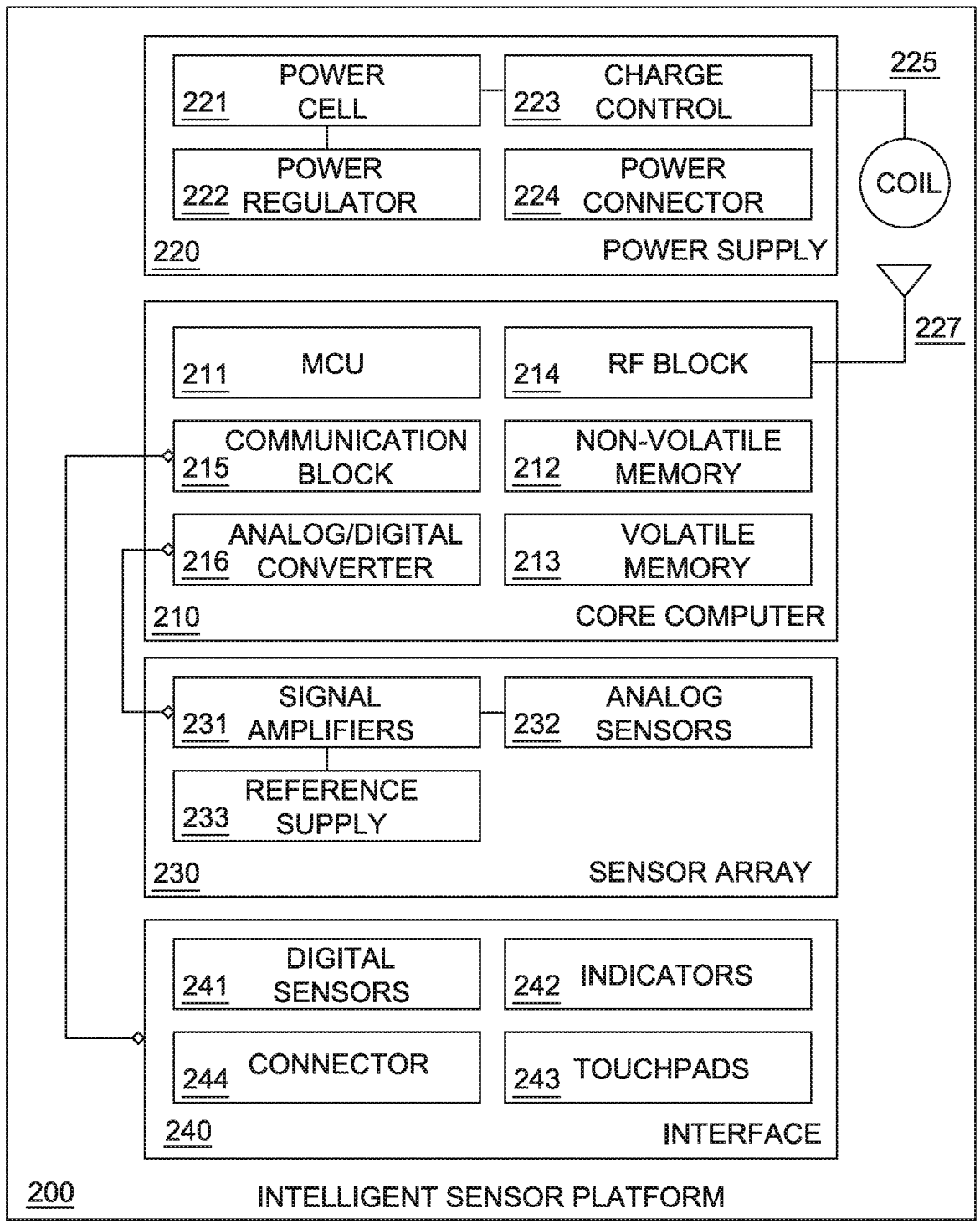
FIG. 2 is a Block diagram of one embodiment of an Intelligent Sensor Platform Architecture.

FIG. 2 illustrates one embodiment of the preferred platform architecture 200 for the flexible computerized sensing apparatus. The platform architecture enables the use of the flexible sensing apparatus.

A core computer 210 in one embodiment includes some amount of volatile work memory 213 and some amount of non-volatile storage memory 212 coupled to micro-controller unit 211. Non-volatile storage memory 212 houses the firmware for the micro-controller and can also house any persistent data, such as system settings, calibration settings, security keys or historical measurement data. In one embodiment, non-volatile memory may be a flash memory. Volatile memory 213 provides working memory for temporary values and buffers, including but not limited to buffers for sensor data and messages.

The core computer also contains one or more of: a communication block 215 to interface with a digital interface block 240 and an analog to digital converter block 216 to interface with an analog sensing block 230. The preferred architecture for the core computer also includes a radio frequency (RF) communication block 214 and matching antenna 217 for transmitting and receiving data and control commands. The RF communication block 214 may be designed to communicate via cellular network, wireless local area network, personal area network, or a combination of the above types of communication protocols.

In some embodiments, all of the elements in the core computer 210 can be housed in a single integrated system-on-chip or SoC, such as those provided by Dialog Semiconductor, Nordic Semiconductor, and Texas Instruments. Alternately, the various elements may be on separate chips, and may communicate via buses or similar mechanisms.

One or more analog sensors may be included in the device. In one embodiment, the analog sensors may include vibration (piezo-electric), acceleration (accelerometer), rotation (gyroscope), orientation (magnetometer), air temperature, air humidity and air pressure sensors. These sensors send data to the volatile memory 213. Frequency of data being sent may be as high as 200 kHz (vibration) and 6.6 kHz (acceleration/rotation), or 1-2 Hz (atmospheric data). The frequency for collecting and sending data may be configured by the operator, in one embodiment.

Analog sensors typically require a reference power supply, in order to present a scaled signal. One embodiment utilizes a dedicated reference power supply 233 for analog sensors 232 which powers the sensors and amplifier block 231. This, in turn, conditions and scales the output from the sensors before presenting the output to the analog to digital converter block 216 of the core computer 210. In another embodiment, the reference power supply can provide power to the rest of the system as well. Together these elements constitute analog sensing block 230. In one embodiment, analog sensing block may be implemented on a separate analog chip.

Those skilled in the art will realize that in one embodiment, the case where the analog sensor 232 is a piezoelectric vibration sensor, the configuration of the amplifier block is a charge amplifier. In the case where the analog sensors are strain gauges, in one embodiment, the configuration of the amplifier block is a differential amplifier. Finally, in one embodiment, amplifier block 231 is constructed with multiple stages to include signal filtration, amplification, and/or attenuation as needed.

Those skilled in the art also appreciate that inclusion of reference power supply 233 allows optional control of the analog sensors 232 by core computer 210 using a digital protocol or general purpose input-output via communication block 215 for a variety of purposes, including but not limited to power savings, calibration, and sensitivity adjustment. In one embodiment, analog sensor sensitivity can be adjusted by the operator.

In one embodiment, digital interface block 240 includes any additional sensors 241 which may be used for a particular sensing application but do not require interfacing to the analog to digital converter block. These additional sensors communicate digitally with the communication block of the core computer and may include but are not limited to accelerometers, gyroscopes, magnetometers, temperature sensors, humidity sensors, pressure sensors, hall effect sensors, and light sensors. Those skilled in the art would understand the use of such additional digital sensors to supplement data from the analog sensors or to act as triggers for analog sensing.

The digital interface block may further include elements to assist with human interaction. These elements include but are not limited to touch pads 243 and indication LEDs 242.

LEDs 242, in one embodiment, may be used to provide direct feedback. In one embodiment, the LEDs 242 may utilize a plurality of colors and/or blinking patterns. In one embodiment, an LED 242 indicates connectivity (strobes blue) and battery state when unconnected (charging, charged). The LED 242 may also provide alerts or feedback. In one embodiment, the LED 242 is activated by alert system 195 in response to computations made by server 150.

Those skilled in the art appreciate that these interface elements are useful for changing and indicating modality, configuration, connectivity, power settings and status of the flexible sensing apparatus.

For interfacing to external systems, in one embodiment the digital interface block may include one or more connector features 244. These features can be actual connector components mounted to the assembly or exposed copper patterns in the circuitry. Those skilled in the art recognize that such connector features may be useful for the purpose of data communication, factory program and test or triggering. In one embodiment, connector features 244 conform to an industry standard connector profile for insertion into readily available ports.

One embodiment of the apparatus also includes power supply 220 which provides power to the entire system. Within the power supply, in one embodiment power regulator 222 converts power from power cell 221 to provide regulated voltage. In one embodiment, regulated voltage is provided to sensors. In one embodiment, regulated voltage is provided to the core computer as well as other system blocks. Charge control block 223 provides regulated charge power to the power cell 221 for re-charging.

In one embodiment, power cell 221 may be a battery. In one embodiment, contactless charging may be used, utilizing a foldable charging coil element 225. Alternately, charging may be via a solar cell, vibration harvesting if the device is attached to a vibrating structure, or other means. In one embodiment, the LEDs 242 may be used to indicate charging status. For example, the LED 242 may indicate charging (solid yellow) and charging complete (solid green), as well as battery low (chirping red). The battery life can be as short as a couple of days and as long as a year, depending on frequency of data taking and wireless communication.

Optional power connector 224 can be used to supply power to the entire system as well as to supply power to the charge control block for re-charging. In one embodiment, re-charging leverages contactless, inductive power transfer via charge coil 225.

In one embodiment, the processor and sensors in the flexible sensing apparatus may be always "on." The flexible sensing apparatus may also have a very passive, ultra-low power state. In one embodiment, the foldable NFC (near-field communication) coil can be used to wake the device up from this state. For example, the flexible sensing apparatus may be woken by touching an NFC capable mobile phone to the flexible sensing apparatus's surface to activate the processor and sensor(s). Those skilled in the art will appreciate that wireless wake-up mechanism such as NFC can also be used to exchange registration and digital security information as part of the wake-up event. Additionally, the NFC mechanism may be used to provide additional data to the flexible sensing apparatus, for example for initialization.

Altogether, the blocks represented in FIG. 2 describe a preferred platform architecture for a flexible sensing apparatus which can be used for mechanical sensing, computation, and even real time decision making.

Figure 3:
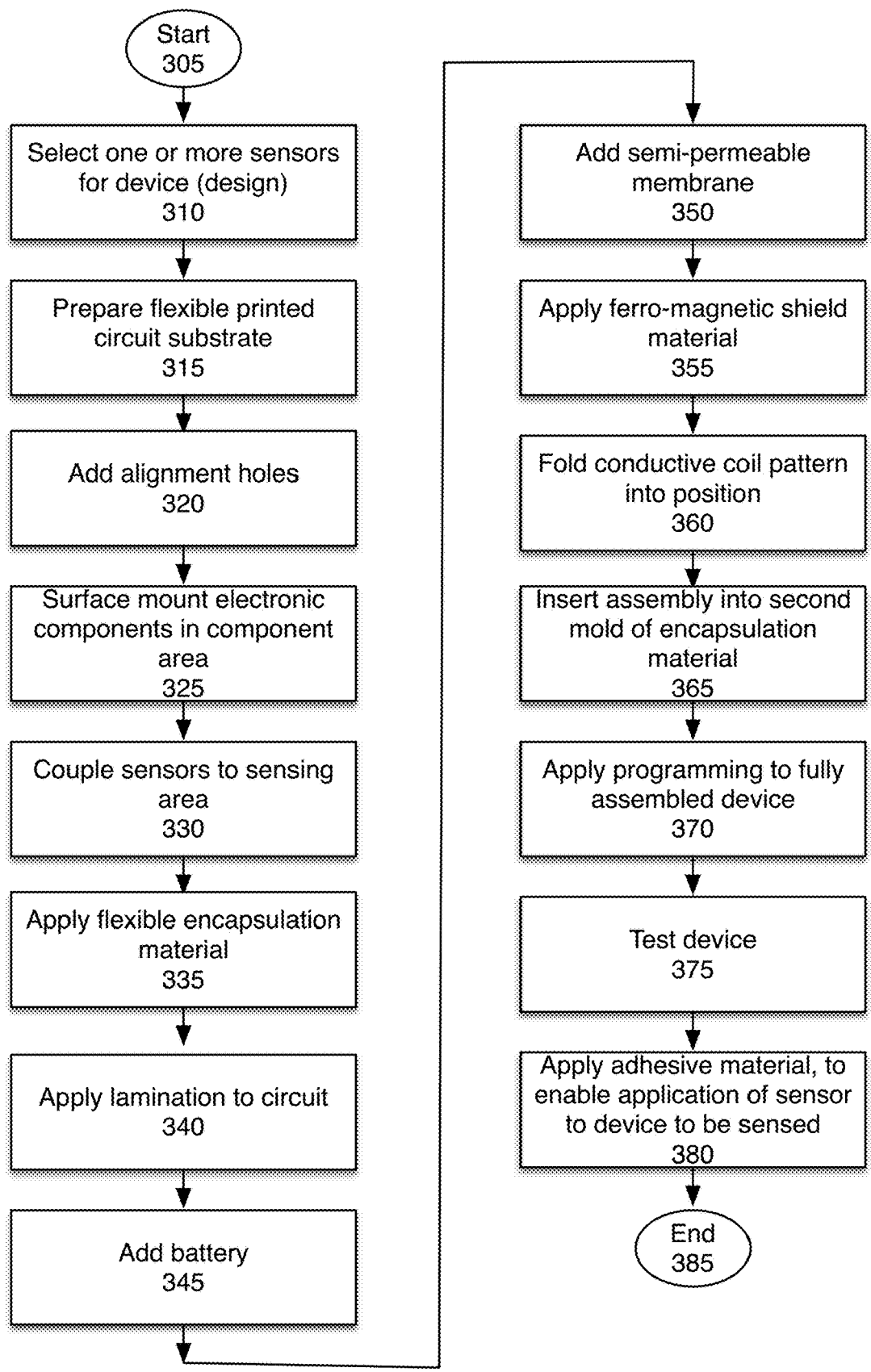
FIG. 3 is a Flowchart showing one embodiment of the Assembly Process for Sensor.

FIG. 3 is a flowchart of one embodiment of the construction and assembly of such an apparatus, suitable for affixing to non-flat mechanical structures and which has excellent mechanical coupling and which is capable of measuring both vibration and dynamic strain at high frequencies.

Additionally, FIGS. 4 through 9, illustrate the construction and assembly of such an apparatus, suitable for affixing to non-flat mechanical structures and which has excellent mechanical coupling.

In one embodiment, the process starts with the selection of one or more sensors for the flexible apparatus, at block 310. In one embodiment, the circuit layout is part of selecting the sensors. The circuit layout includes a substrate and a plurality of sensors, as well as support structures for the sensors, as noted in FIG. 2 above.

Figure 4:
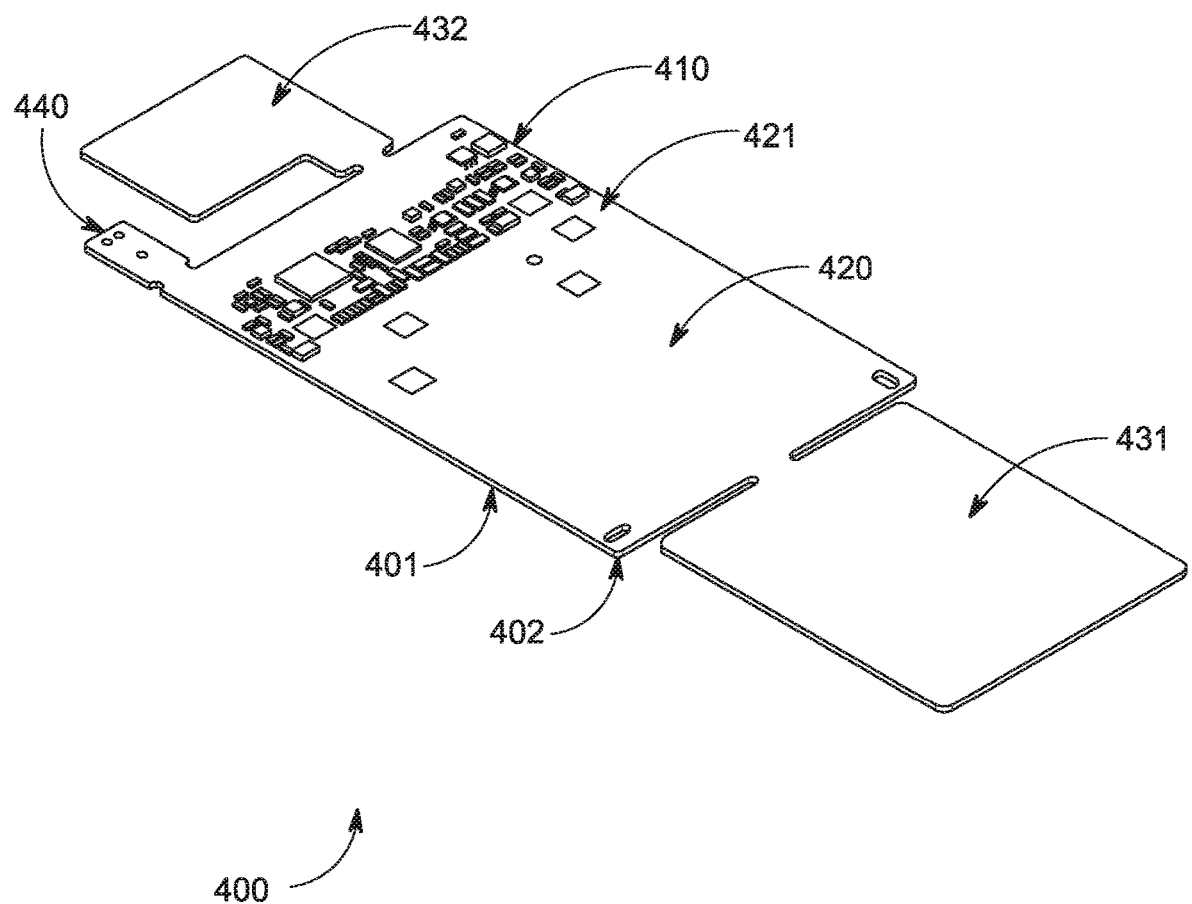
FIG. 4 is an Illustration of one embodiment of a Flexible Printed Circuit Sub-Assembly.

At block 315, a flexible printed circuit substrate is prepared. FIG. 4 illustrates a flexible printed circuit subassembly 400 which serves as the foundation for the apparatus. The flexible printed circuit substrate 401 contains a combination of conductive pathways and insulating materials, laminated together to form a conductive electrical circuit pattern. Typical materials are copper for conductive electrical patterns and a polyamide film such as KAPTON™ for insulating material.

At block 320, in one embodiment, a number of alignment holes are added to the substrate. The preferred embodiment of flexible printed circuit substrate 401 includes a number of alignment holes 402 for alignment during the apparatus assembly processes, such as onto fixtures or within mold cavities. In one embodiment, the alignment holes are die-cut as part of the construction process for the substrate 401 itself.

At block 325, the electronic components to implement the recommended platform are surface mounted to the flexible printed circuit substrate within the electronic component area 410. A typical method for mounting electronic components to a flexible printed circuit substrate is to apply solder paste in a pattern to the surface, and use computerized assembly mechanisms to pick and place the components onto the surface and then to heat activate, thereby reflowing, the solder paste to create a solid metallic electrical bond between the electronic components and the conductive circuit pattern of the substrate.

At block 330, the sensors are coupled to a sensing area 420. Mechanical sensing of vibration, strain and flexion requires tight mechanical coupling between the structure to be sensed and the sensors themselves. Electronic components and metallic bonds, such as solder, located at the sensing site introduce both thickness and mechanical rigidity and, in general, interfere with such mechanical coupling. Additionally, for sensors such as with piezo-electric sensors and strain gauges, a minimum amount of surface area is required to mechanically actuate the sensors. For these reasons, one embodiment of flexible circuit sub-assembly 400 includes a dedicated sensing area 420 which does not overlap electronic component area 410. The dedicated sensing area 420 is kept thin and flexible such that it conforms to the structure to be sensed. In contrast, in one embodiment, the surface mounted electronic components in the electronic component area 410 may be rigid.

In order to make electrical contact with mechanical sensors, such as piezo-electric sensors, and to make contact with a second printed flexible circuit substrate, one embodiment of flexible printed circuit substrate 401 includes a set of exposed conductive pads 421. These pads are within the dedicated sensing area 420 and are not covered with additional conductive material, such as electrical solder, during the construction process of flexible printed circuit sub-assembly 400.

One embodiment of platform 100 includes both an antenna 117 for radio frequency communication and a charge coil 123 for wireless power cell re-charging. In one embodiment, off-the-shelf components may be used for the antenna and charge coil, which can be affixed to the flexible printed circuit sub-assembly and electronically bonded to the circuit. However, to minimize thickness of the apparatus, maintain physical flexibility, simplify assembly and improve manufacturability, in one embodiment, antenna 117 is implemented as an antenna printed conductive pattern 432 within flexible printed circuit substrate 401. In one embodiment, coil 123 is implemented as a charging printed conductive pattern 431 within flexible printed circuit substrate 401. Further, in one embodiment, the perimeter shape of flexible printed circuit substrate 401 is die-cut such that a bendable joint is formed between the charging printed conductive coil pattern 431 and the remainder of flexible printed circuit substrate 401, creating a foldable element from the area containing the charging coil pattern 431. In one embodiment, a similar foldable element is created by introducing a bendable joint between antenna pattern 432 and flexible printed circuit substrate 401. In one embodiment, foldable elements are folded over the remainder of flexible printed circuit assembly 400 as described below.

In order to program the non-volatile memory 113 of platform 100, to perform factory validation tests, or to electronically interface with external systems, in some embodiments implementers may choose to include one or more connectors 144. In one embodiment, connectors 144 are implemented as one or more tab elements 440 of flexible printed circuit substrate 401. In one embodiment, tab element 440 is an element that extends from the main body of the flexible circuit printed circuit board, so that the tab element 440 connector may be inserted into a port. In one embodiment, the flexible tab element 440 may be cut away when no longer required, such as after final factory test, in block 375. In one embodiment, backing material is applied to flexible tab element 440 such that it conforms to mechanical requirements for insertion into commonplace ports, such as those manufactured by Molex.

Figure 5:
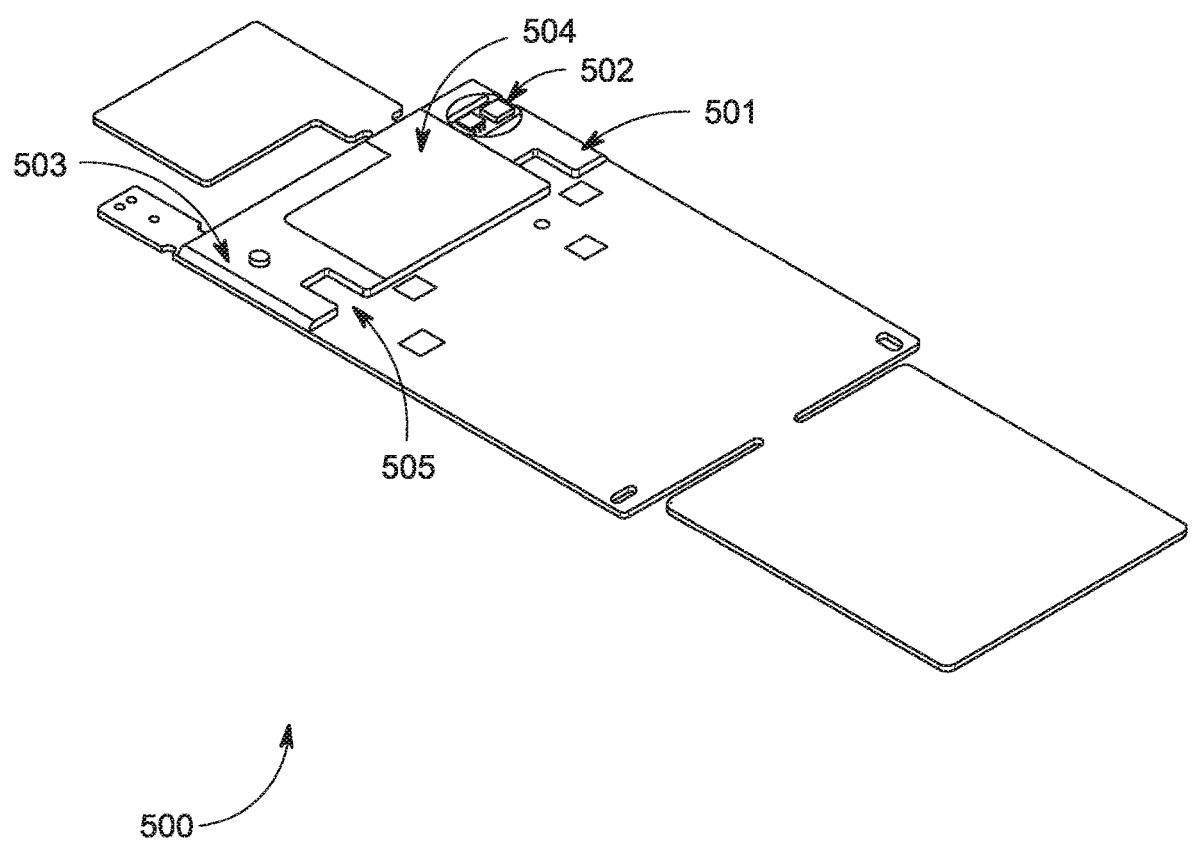
FIG. 5 is an Illustration of one embodiment of an Encapsulated Flexible Printed Circuit Sub-Assembly.

At block 335, a flexible encapsulation is applied to the circuit sub-assembly. FIG. 5 illustrates an encapsulated flexible printed circuit sub-assembly 500, constructed by applying flexible encapsulation material 501 over the electronic component area of the flexible printed circuit sub-assembly 400 from FIG. 4. In one embodiment, the encapsulation is applied only over the component area 410 of flexible printed circuit sub-assembly 400. In one embodiment, the encapsulation is poured over the flexible printed circuit sub-assembly. In another embodiment, the encapsulation is poured over the entire printed circuit sub-assembly. A variety of hot moldable materials or chemically activated materials can be chosen, such as electronic potting compounds like silicone rubber gel or epoxy resin, provided that the heat required or generated does not destroy the electronic bonds or components on the sub-assembly. Alternatively, a conformal coating may be applied.

In one embodiment, the flexible encapsulation material 501 includes a molded light pipe feature 503 for projecting light from LED indicators 142 of platform 100. For this reason, in one embodiment, the material selected for encapsulation is transparent or translucent in color. In one embodiment, translucent Henkel Technomelt 6208 is used for the encapsulation material and is applied using a molding process.

Additional features of flexible encapsulation material 501 include, in one embodiment, an alignment area 504 to provide a recessed portion of the encapsulation to receive foldable printed conductive antenna pattern 431 of printed circuit sub-assembly 400 from FIG. 4. In one embodiment, the encapsulation material 501 shape includes battery cutouts 505 which leave contact pads in the component area 410 of FIG. 4 exposed and allow for soldering of power-cell 121 to the exposed pads in the step, as outlined below. Those skilled in the art will appreciate that cutouts 505 allow for battery attachment after encapsulation material 501 is applied, avoiding damage to the battery from potentially high temperatures during application of the encapsulation material. Additionally, cutouts 505 may permit battery replacement without damaging the encapsulated circuit elements.

In one embodiment, if a sufficiently low temperature encapsulation material is used, encapsulation at block 335 can be applied after the lamination stage in block 340 and battery attachment in block 345. Those skilled in the art will appreciate that by postponing over-mold block 335 until after blocks 340 and 345, the result will yield an electronically and mechanically sealed sub-assembly, which can be tested and certified as a functioning unit prior to any additional assembly steps.

If additional sensors 141 include atmospheric or chemical sensors which must come in contact with the outside environment, one embodiment includes molded aperture 502 as a feature of encapsulation material 501. In one embodiment, the aperture provides both an air channel and a pattern to receive a protective membrane. In one embodiment, the protective membrane may be of an oleophobic type such as GAW3250509 manufactured by Gore.

Figure 6:
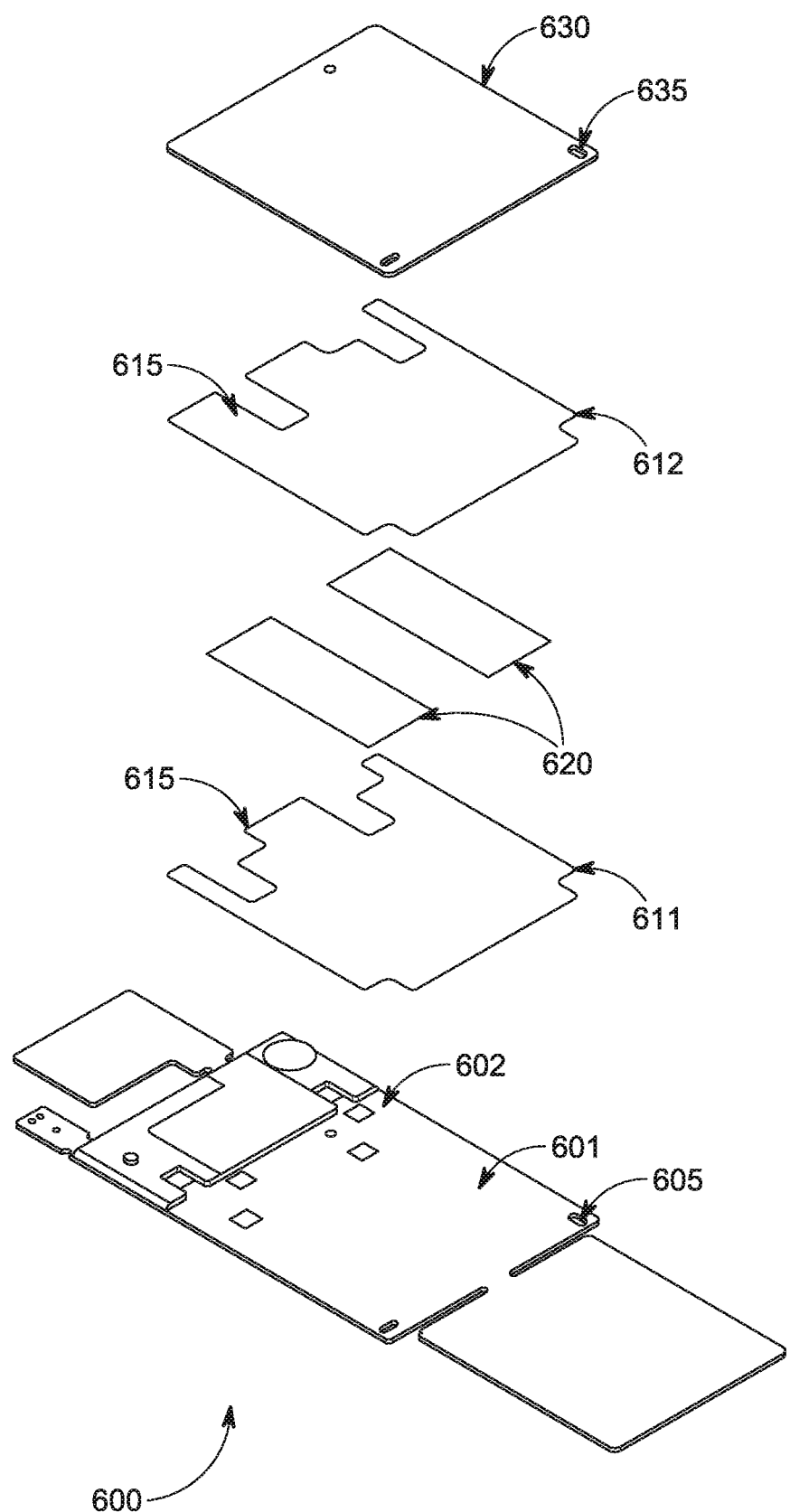
FIG. 6 is an Illustration of one embodiment of an exploded view of a Laminated Flexible Printed Circuit Assembly.

At block 340, lamination is applied to the flexible circuit sub-assembly to form a laminated sensor assembly. FIG. 6 illustrates the component layers and steps to construct laminated sensor assembly 600. Sensors 620 are laminated between lamination area 601 of first flexible printed circuit sub-assembly, which roughly coincides with dedicated sensing area 420 from FIG. 4, and a second flexible printed circuit sub-assembly 630.

In one embodiment, the lamination is done by using a die cut adhesive layer 611 beneath the sensors 620 and a die cut adhesive layer 612 above the sensors 620. A variety of flexible thin adhesives, such as 3M Scotch 583 thermal bonding film, can be die-cut and used for adhesive layers 611 and 612.

In one embodiment, low temperature heat activated adhesive material is thermoformed using a heated press for the lamination. Those skilled in the art will recognize that the choice of adhesive is contingent on final requirements and heat sensitivity of sensors 620.

In one embodiment, an overall thickness of 0.10 mm or less for laminated component layers (600, 611, 612, 620 and 630) is achieved. Those skilled in the art will appreciate that by keeping the overall laminated thickness very low, the final apparatus remains mechanically flexible and can be made to conform to non-flat surfaces, widely expanding is applicability, including its usefulness in dynamic strain and flexion measurements.

Upward facing exposed conductive pads 602 within lamination area 601 of first flexible printed circuit sub-assembly make electrical contact with the bottom surface of sensors 620. Equivalent exposed downward facing conductive pads on the underside of the second flexible printed circuit sub-assembly 630 make electrical contact with top surface of sensors 620. In one embodiment, electrical conductivity is made through mechanical contact between exposed pads 602 and the conductive surfaces of sensors 620. In another embodiment, semi-conductive adhesive material is applied to exposed pads 602, such as graphene paste, to both mechanically affix sensors 620 to the exposed pads 602 and make electrical contact. In other embodiments, a conductive carbon infused tape or metal infused glue may be used. Those skilled in the art will appreciate that certain sensors, such as piezo-electric sensors, have high intrinsic impedance and can tolerate significant resistivity, allowing for a wide variety of possible conductive adhesives.

Die cut adhesive layers 611 and 612 include cutout features 615 in the perimeter outlines which allow exposed pads 602 to come in contact with sensors 620. In one embodiment, cutout features 615 allow additional exposed pads 602 to come in contact with matching exposed pads on the underside of second flexible printed circuit sub-assembly 630. In one embodiment, the areas of adhesive layers 611 and 612, excluding cutout features 615, act as insulators.

In one embodiment, to assist with alignment during lamination process 340, alignment features 605 are included in the lamination area 601 of first flexible printed circuit sub-assembly and mate with matching feature 635 in the flexible printed circuit sub-assembly 630. In one embodiment, these alignment features are die-cut as part of the fabrication of the substrate for flexible printed circuit sub-assemblies.

Those skilled in the art will appreciate that just as coil and antenna elements 431 and 432 from FIG. 4 can be printed as part of flexible printed substrate 401, certain types of sensors, such as strain gauges, can be similarly printed. In one embodiment a strain gauge is included as part of one of either flexible printed sub-assemblies.

Further, in an alternative embodiment, the second flexible circuit sub-assembly 630 is fabricated and die-cut as a foldable element of flexible circuit sub-assembly 600 rather than as a separate flexible circuit sub-assembly. In this embodiment, block 340 consists of folding element 630 over flexible circuit sub-assembly 600, with sensors 620 and adhesive layers 611 and 612 in between to laminate together the flexible circuit subassembly 630 and second flexible circuit sub-assembly 630, into laminated sensor assembly 600. Those skilled in the art recognize that this alternative embodiment may in one embodiment replace some or all of the exposed conductive pads with conductive traces that cross the bendable joint.

Figure 7:
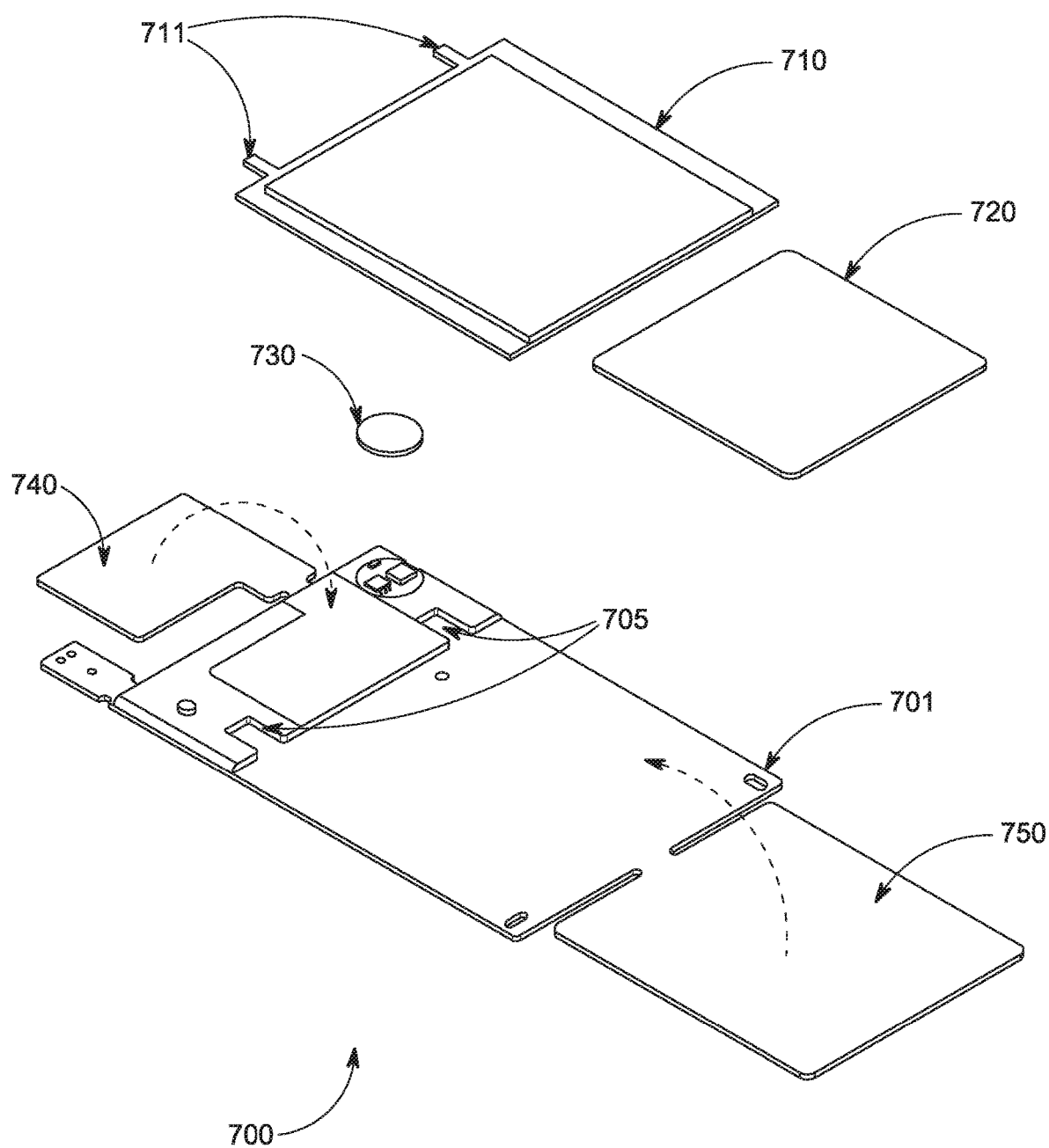
FIG. 7 is an Illustration of one embodiment of an Assembled Sensor Apparatus.

At block 345, a battery is added. FIG. 7 illustrates the steps and components required to construct assembled sensor apparatus 700, which represents a working apparatus embodying the platform 100. A battery 710, in one embodiment corresponding to power cell 121 of FIG. 1, is affixed to laminated sensor assembly 701, which includes sensors laminated between a first and second flexible printed circuit sub-assembly from FIG. 6. In one embodiment, the battery 710 is mechanically affixed to laminated sensor assembly 701 with a thin flexible adhesive. In an alternative embodiment, battery 710 is affixed to sensor assembly 701 with glue. In one embodiment, battery 710 includes electrical tabs 711 which are electrically coupled to exposed pads 705 on laminated sensor assembly 701 in order to make electrical contact. In one embodiment, the tabs 711 may be soldered. In one embodiment, battery 710 incorporates an electrical connector which is mated with a second electrical connector incorporated as part of laminated sensor assembly 701.

At block 350, if atmospheric or chemical sensors are included as part of the apparatus, in one embodiment, a semi-permeable membrane 730 is affixed to molded aperture feature. The aperture 502 from FIG. 5 is incorporated into encapsulation material 501.

Finally, since foil and metallic materials in battery 710 can interfere with the inductance of the printed conductive coil pattern of charging coil, antenna, and/or sensor, in one embodiment at block 355, ferro-magnetic shield material 720 is applied to the coil area 750 of laminated sensor assembly 701, facilitating the subsequent folding operation at block 360. Such shields are readily available in die-cut, adhesive form from a variety of manufacturers.

Figure 8:
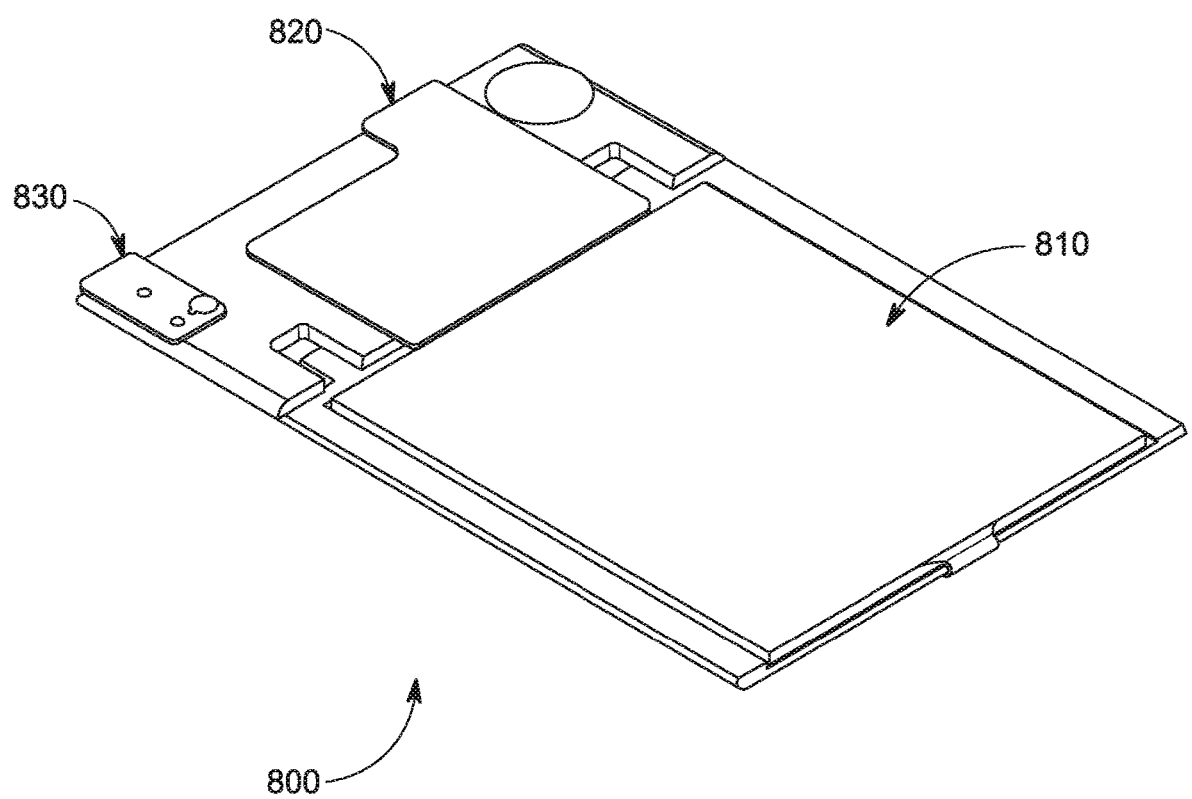
FIG. 8 is an Illustration of one embodiment of a Folded Sensor Apparatus.

At block 360, in one embodiment, printed conductive coil area is folded over battery 710. FIG. 8 represents the elements for constructing folded sensor assembly 800 prior to enclosure of the final apparatus. The coil area 750 is folded into position 810, as illustrated. In one embodiment, printed conductive antenna pattern 432 from FIG. 4 is folded 740 into position 820 over alignment area 504 of encapsulating material 501 from FIG. 5. In one embodiment, thin adhesive material or glue can be used to hold folded elements in place. In one embodiment, the die-cut ferro-magnetic shield 720 is fabricated with double-sided adhesive such that it affixes coil area 750 to battery 710.

In one embodiment, at block 360, tab element 440 from FIG. 4 is folded into position 830. In an alternative embodiment, tab element 440 is left unfolded, protruding from the laminated flexible circuit assembly, so that it can be used for programming and testing in block 370 and/or removed in a subsequent step.

Figure 9:
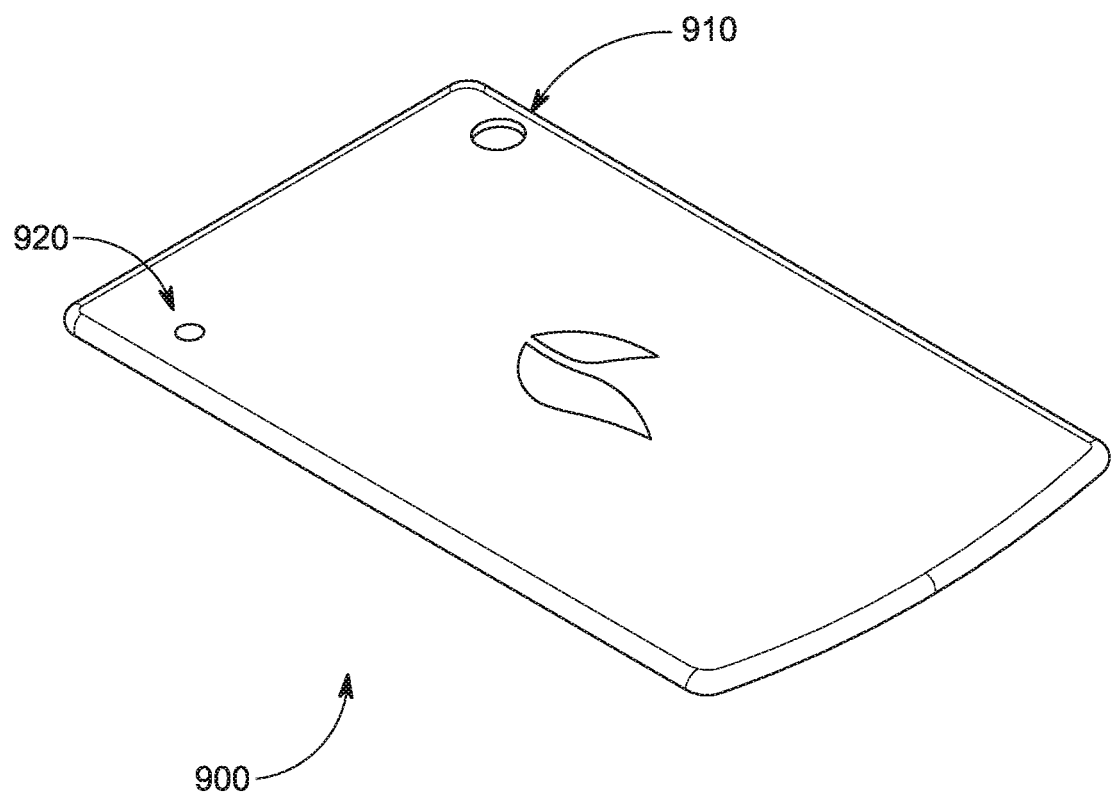
FIG. 9 is an Illustration of one embodiment of an Encased Sensor Apparatus.

At block 365, once folded sensor assembly 800 from FIG. 8 is completed, the entire assembly is encased in a flexible protective material to produce final sensor apparatus 900. FIG. 9 illustrates the final encased apparatus. If the apparatus has an LED indicator, in one embodiment the protective material contains perforation feature 920 which allows molded light pipe feature 503 from FIG. 5 to project light. Additionally, if the apparatus includes environmental or chemical sensors, in one embodiment the protective material contains an orifice or opening 910 to allow air to come in contact with either semi-permeable membrane 730 from FIG. 7 or pass through to the sensors themselves via molded aperture 502 from FIG. 5. A variety of hot moldable materials or chemically activated materials can be chosen for the protective material, provided that the heat required and exposure time does not damage the battery 710 or sensors. In one embodiment, opaque protective material is used to completely enclose and seal the apparatus from light and chemical exposure, except via explicit features 910 and 920. A suitable material is opaque black Henkel Technomelt 6208.

For mechanical sensing, it is important that good mechanical coupling exist between the structure to be sensed and the flexible sensor apparatus 700 which contains the actual sensors laminated within it. For this reason, in one embodiment, the protective material is only applied to the top side of folded sensor apparatus 800 to create final sensor apparatus 900 with the flexible printed substrate exposed on the underside.

At block 370, the apparatus, now fully assembled, is programmed. In one embodiment, the non-volatile storage memory in the system is flashed with firmware for the micro-controller and any persistent data, such as system settings, calibration settings, security keys. In one embodiment, the system is given a unique identifier, which is used in communicating and tracking this particular item. In one embodiment, programming and setting a unique identifier is done using flexible tab element 440 as a connector. In one embodiment, tab element 440 is removed after programming and setting a unique identifier. In one embodiment, tab element 440 is removed after testing.

At block 375, the system is tested. In one embodiment, the flexible tab element 440 may be used to run test data through the system. In one embodiment, in addition to testing through tab element 440, the functioning of the wireless connection is also tested. Once tested the system is ready for affixation to and analysis of a physical structure. In one embodiment, tab element 440 is removed after testing. In an alternative embodiment, tab element 440 is left intact for future interfacing to the apparatus and system. In one embodiment, if tab element 440 is left intact, it may be folded, as shown in FIG. 8.

At block 380, in one embodiment, thin adhesive material is applied to the underside of apparatus 900 so that it can be readily affixed to the structure to be sensed. In one embodiment, branding and regulatory markings are printed on the underside of apparatus 900 as part of the silk-screen of flexible printed circuit substrate 401. In an alternative embodiment, branding and regulatory markings are incorporated into the adhesive material backing.

The process of manufacturing ends, at block 385.

Figure 10:
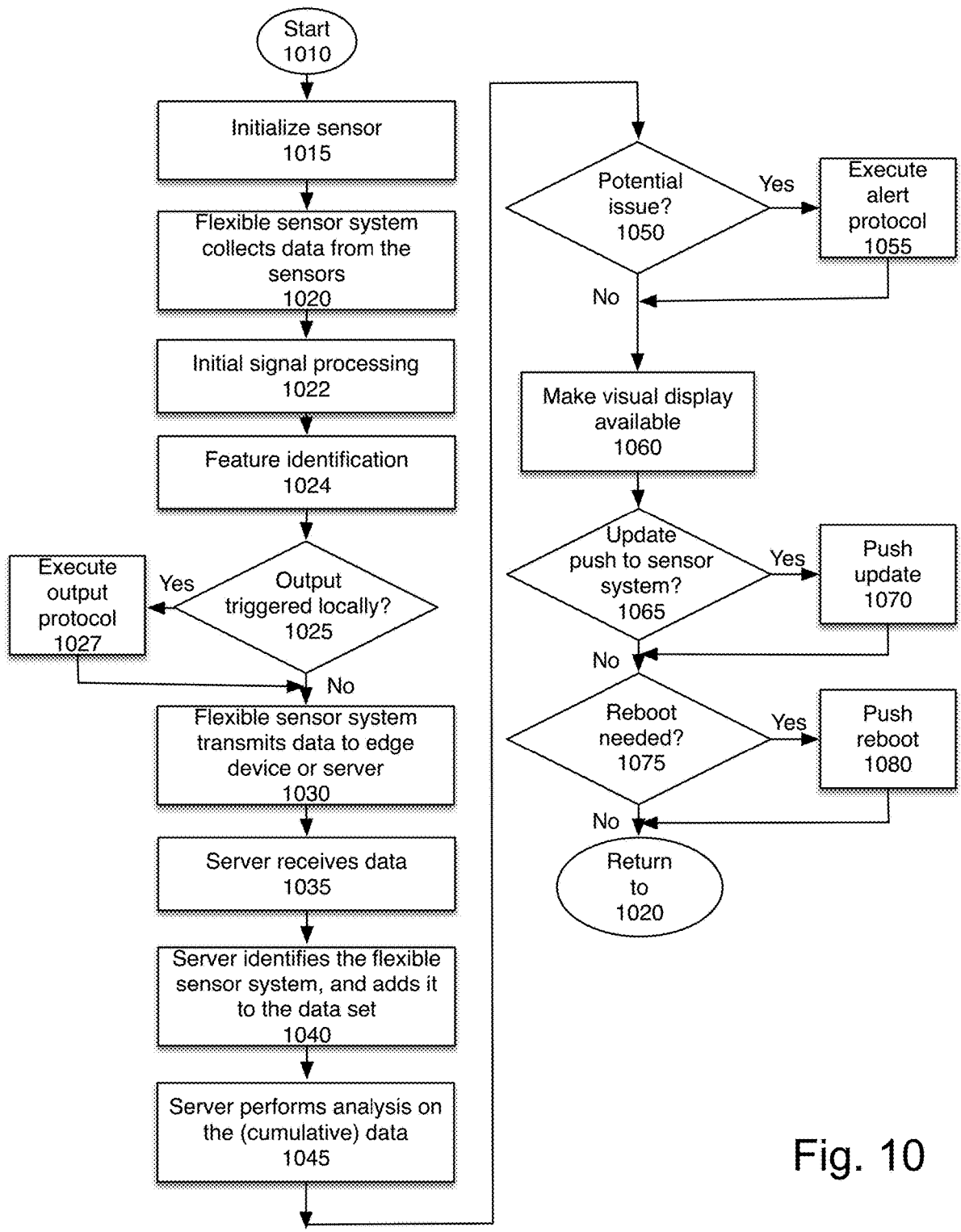
FIG. 10 is a Flowchart showing one embodiment of the use of the Sensor Platform Architecture.

FIG. 10 is a flowchart of one embodiment of utilizing the sensor system. The process starts at block 1015, when the sensor apparatus (SA) is attached to an object, and initialized. In one embodiment, attachment is to closely fit the sensor system to the device to be monitored. After the device is securely attached, the device is initialized. In one embodiment, initialization may be started through a mobile application which sends an initialization signal. In one embodiment, initialization may be started through a wireless signal. In one embodiment, initialization may be done through an NFC connection. In one embodiment, initialization may be started in response to data received from one or more sensors with amplitude exceeding an adjustable threshold. In one embodiment, initialization may be started in response to a periodic timing event.

At block 1020, the sensor system starts collecting data from the one or more of its sensors. In one embodiment, the volatile memory in the sensor system receives the output of the sensors. In one embodiment, the flexible sensor buffers the data, prior to sending it. In another embodiment, the flexible sensor continuously sends data using a protocol such as Bluetooth Low Energy (BLE).

In one embodiment, at block 1022, the micro-controller on the flexible sensor pre-processes the data from the sensors. In one embodiment, the pre-processing comprises signal processing such as applying FFT, filters, and other processing. In one embodiment, this reduces the size of the data set.

In one embodiment, at block 1024, the micro-controller is used to identify key features in the sensor signal. In one embodiment, feature identification identifies signal peaks, or signals above a particular threshold.

At block 1025, the process determines, based on the data collected by the sensor system, whether an output should be triggered locally. In one embodiment, this is based on identified features from block 1024. An output is triggered, in one embodiment, if the flexible sensor system determines that the data requires an output. If so, at block 1027, the output protocol is executed. In one embodiment, the output may be an alert. In one embodiment, the output protocol may provide for automatic pausing, stopping, slowing down, and/or disabling of the structure which is being monitored. In one embodiment, the output protocol may be a message sent to the user's device indicating an issue or condition.

At block 1030, the sensor system transmits the data wirelessly to the edge device, or to the server. In one embodiment, the transmission is via a Wi-Fi. In another embodiment, the transmission is via cellular network. In yet another embodiment is via Bluetooth Low Energy (BLE). In one embodiment, the transmission is directly between the sensor system and the server. In another embodiment, the transmission is to and edge device which, in turn, can choose to further transmit to the server. In one embodiment, the edge device is the operator's mobile device.

In one embodiment, transmission at block 1030 involves a first sensor apparatus (SA) transmitting to a second sensor apparatus, the second apparatus forwarding the transmission to a third apparatus and so on, in a mesh network, such that the transmission ultimately arrives at a sensor apparatus that has a transmission to link to the server or to an edge device.

At block 1035, the server receives the sensor data.

At block 1040, the server identifies the individual flexible sensor system from which this data came, based on the sensor identifier in the data, and adds it to the data set for the sensor.

At block 1045, the system performs analysis on the data. The analysis in one embodiment, may compare the data to known good data, to identify discrepancies, or indications of potential issues. In one embodiment, the analysis is based on past data from the same sensor, and current data. In one embodiment, the analysis is based on cumulative data from many sensors monitoring similar devices. In one embodiment, a machine learning system may be used to utilize the data from many flexible sensor systems to create a smart problem identification system. In one embodiment, the system may provide an indication of what may have caused the change. In one embodiment, this data may be developed over time, based on sensor data. In one embodiment, the analysis may clean up the data further, for visual presentation.

At block 1050, the process determines whether there is a potential issue, based on the data analysis. If so, at block 1055, an alert protocol is executed. The alert protocol in one embodiment may include notifying the user of the issue. In one embodiment, the alert protocol may trigger visual or audio alarms. In one embodiment, the alert protocol may shut down, or otherwise adjust one or more settings of the structure being monitored automatically. In one embodiment, the alert protocol may send a signal back to the sensor apparatus (SA) associated with the alert condition, causing a feature such as a LED indicator on the sensor apparatus to change state. Other methods of alerting about, or directly addressing, an identified issue may be used.

At block 1060, the visual display of the sensor data is made available to the user. In one embodiment, the visual display is made available via a web page, an application, or a dedicated display to which data is sent. The visual display in one embodiment provides status information about the monitored structure over time. For example, the level of vibration or sound may be provided in a visual format.

At block 1065, the process determines whether any of the parameters of the sensor system should be updated. In one embodiment, this may occur for added/alternate functionality, or to update thresholds for alerts, etc. In one embodiment, the added alternate functionality may provide more data pre-processing, or otherwise reprogram the micro-controller. If an update is needed, at block 1070, the update is pushed to the flexible sensor system.

At block 1075, the process determines whether the sensor system needs to be rebooted. In one embodiment, the system can force a re-boot. Also, in one embodiment, an internal crash will cause a watchdog to reboot it. In one embodiment, depletion of the battery will result in a reboot once it sees a charger. If a reboot is needed, at block 1080 the system is rebooted.

The process then returns to block 1020, to continue receiving data from the sensors.

Figure 11:
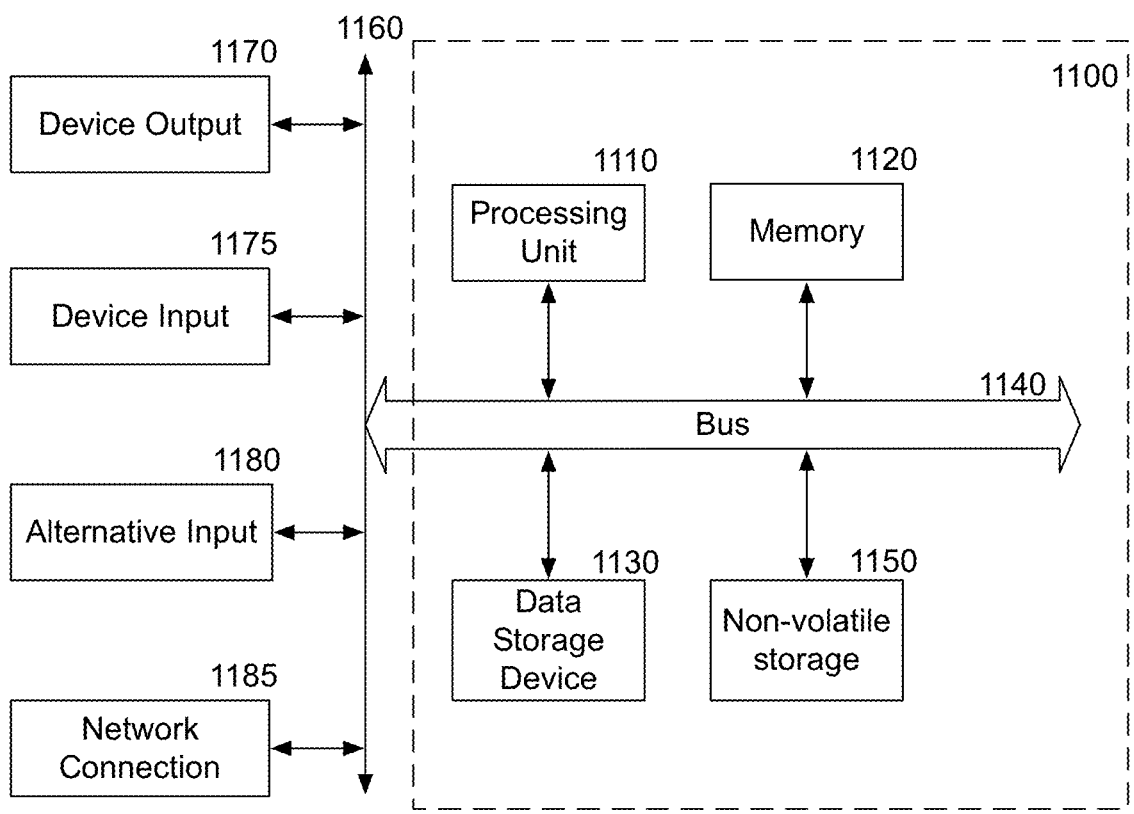
FIG. 11 is a Block diagram of one embodiment of a computer system that may be used with the present application.

FIG. 11 is a block diagram of one embodiment of a computer system that may be used with the present invention. The server, edge device, and/or user devices may be implemented as a computer system. It will be apparent to those of ordinary skill in the art, that alternative systems of various system architectures may also be used.

The computer system illustrated in FIG. 11 includes a bus or other internal communication means 1140 for communicating information, and a processing unit 1110 coupled to the bus 1140 for processing information. The processing unit 1110 may be a central processing unit (CPU), a digital signal processor (DSP), or another type of processing unit 1110.

The system further includes, in one embodiment, a random access memory (RAM) or other volatile storage device 1120 (referred to as memory), coupled to bus 1140 for storing information and instructions to be executed by processing unit 1110. Main memory 1120 may also be used for storing temporary variables or other intermediate information during execution of instructions by processing unit 1110.

The system also comprises in one embodiment a read only memory (ROM) 1150 and/or static storage device 1150 coupled to bus 1140 for storing static information and instructions for processing unit 1110. In one embodiment, the system also includes a data storage device 1130 such as a magnetic disk or optical disk and its corresponding disk drive, or Flash memory or other storage which is capable of storing data when no power is supplied to the system. Data storage device 1130 in one embodiment is coupled to bus 1140 for storing information and instructions.

The system may further be coupled to an output device 1170, such a liquid crystal display (LCD) coupled to bus 1140 through bus 1160 for outputting information. Other output devices may include light emitting diodes (LEDs), Organic Light Emitting Diodes (OLEDs), or other visual output elements. The output device 1170 may be an audio output device, such as a speaker, or alarm. The output device 1170 may be a tactile output device (e.g. a vibration motor). Other output devices 1170 which may be used to provide feedback to the user may be utilized.

An input device 1175 may be coupled to the bus 1160. The input device 1175 may be an alphanumeric input device, such as a physical or visual keyboard including alphanumeric and other keys, for enabling a user to communicate information and command selections to processing unit 1110. An additional user input device 1180 may further be included. One such user input device 1180 is cursor control device 1180, such as a touchpad, mouse, a trackball, stylus, cursor direction keys, or touch screen, may be coupled to bus 1140 through bus 1160 for communicating direction information and command selections to processing unit 1110, and for controlling movement on display device 1170.

Another device, which may optionally be coupled to computer system 1100, is a network device 1185 for accessing other nodes of a distributed system via a network. The communication device 1185 may include any of a number of commercially available networking peripheral devices such as those used for coupling to an Ethernet, token ring, Internet, or wide area network, personal area network, wireless network or other method of accessing other devices. The communication device 1185 may further be a null-modem connection, or any other mechanism that provides connectivity between the computer system 1100 and the outside world.

Note that any or all of the components of this system illustrated in FIG. 11 and associated hardware may be used in various embodiments of the present invention.

It will be appreciated by those of ordinary skill in the art that the particular machine that embodies the present invention may be configured in various ways according to the particular implementation. The control logic or software implementing the present invention can be stored in main memory 1120, mass storage device 1130, or other storage medium locally or remotely accessible to processing unit 1110.

It will be apparent to those of ordinary skill in the art that the system, method, and process described herein can be implemented as software stored in main memory 1120 or read only memory 1150 and executed by processing unit 1110. This control logic or software may also be resident on an article of manufacture comprising a computer readable medium having computer readable program code embodied therein and being readable by the mass storage device 1130 and for causing processing unit 1110 to operate in accordance with the methods and teachings herein.

The present invention may also be embodied in a handheld or portable device containing a subset of the computer hardware components described above. For example, the handheld device may be configured to contain only the bus 1140, processing unit 1110, and memory 1150 and/or 1120.

The handheld device may be configured to include a set of buttons or input signaling components with which a user may select from a set of available options. These could be considered input device #1 1175 or alternate input device #2 1180. The handheld device may also be configured to include an output device 1170 such as a liquid crystal display (LCD) or display element matrix for displaying information to a user of the handheld device. Conventional methods may be used to implement such a handheld device. The implementation of the present invention for such a device would be apparent to one of ordinary skill in the art given the disclosure of the present invention as provided herein.

The present invention may also be embodied in a special purpose appliance including a subset of the computer hardware components described above, such as a kiosk or a vehicle. For example, the appliance may include a processing unit 1110, a data storage device 1130, a bus 1140, and memory 1120, and no input/output mechanisms, or only rudimentary communications mechanisms, such as a small touch-screen that permits the user to communicate in a basic manner with the device. In general, the more special-purpose the device is, the fewer of the elements need be present for the device to function. In some devices, communications with the user may be through a touch-based screen, or similar mechanism. In one embodiment, the device may not provide any direct input/output signals, but may be configured and accessed through a website or other network-based connection through network device 1185.

It will be appreciated by those of ordinary skill in the art that any configuration of the particular machine implemented as the computer system may be used according to the particular implementation. The control logic or software implementing the present invention can be stored on any machine-readable medium locally or remotely accessible to processing unit 1110. A machine-readable medium includes any mechanism for storing information in a form readable by a machine (e.g. a computer). For example, a machine readable medium includes read-only memory (ROM), random access memory (RAM), magnetic disk storage media, optical storage media, flash memory devices, or other storage media which may be used for temporary or permanent data storage. In one embodiment, the control logic may be implemented as transmittable data, such as electrical, optical, acoustical or other forms of propagated signals (e.g. carrier waves, infrared signals, digital signals, etc.)

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A method for constructing a low-profile, computerized sensing apparatus comprising:
   bonding a first flexible circuit sub-assembly, including a sensor electrically coupled to the first flexible circuit sub-assembly, with a second flexible circuit sub-assembly including one or more circuit elements coupled to the second flexible circuit sub-assembly, using die-cut activated adhesive;
   positioning the sensor of the first flexible circuit sub-assembly between the first and second flexible circuit sub-assemblies, such that the sensor remains electrically coupled to the first flexible circuit sub-assembly and becomes electrically coupled to the second flexible circuit sub-assembly during bonding, forming a laminated flexible circuit assembly with the sensor within, the laminated flexible circuit assembly retaining flexibility and an ability to conform to a shape of a structure to which it is attached.

2. The method of claim 1, wherein the sensor is electrically coupled to one or both of the first flexible circuit sub-assembly and the second flexible circuit sub-assembly utilizing exposed pads on either one or both the first and second flexible circuit sub-assemblies.

3. The method of claim 2, further comprising:
   adding a conductive material to the exposed pads, the conductive material comprising one of: conductive glue, graphene paste, carbon tape, or copper tape, to form an electrical connection between the exposed pads and the sensor.

4. The method of claim 1, wherein the first flexible circuit sub-assembly and the second flexible circuit sub-assembly contain alignment features for aligning the second flexible circuit sub-assembly with the first flexible circuit sub-assembly.

5. The method of claim 1, wherein one or both of the first flexible circuit sub-assembly or second flexible circuit sub-assembly includes an integral foldable element coupled via a bendable joint;
   wherein the foldable element is assembled in one of two configurations: folded over the laminated flexible circuit assembly or unfolded and protruding from the laminated flexible circuit assembly.

6. The method of claim 5, further comprising:
   applying a protective encapsulation material to the laminated flexible circuit assembly, wherein the foldable element remains exposed after the application;
   wherein the foldable element is assembled in one of two configurations: folded over the encapsulation material or remaining unfolded.

7. The method of claim 6, further comprising:
   using the unfolded foldable element for testing and verification of the laminated flexible circuit assembly; and
   cutting the exposed foldable element after applying the encapsulation material, after the testing and verification is completed.

8. The method of claim 5, wherein the foldable element includes a conductive antenna pattern.

9. The method of claim 8, wherein the foldable element includes an inductor pattern.

10. The method of claim 1, wherein the first flexible circuit sub-assembly and the second flexible circuit sub-assembly are a unitary piece, the unitary piece including the first flexible sub-assembly, the second flexible circuit sub-assembly being a foldable element of the first flexible circuit sub-assembly, and a folding portion connecting the first flexible circuit sub-assembly and the second flexible circuit sub-assembly and the bonding comprises:
    folding the foldable element over the first flexible circuit sub-assembly;
    bonding the first flexible circuit sub-assembly to the second flexible circuit sub-assembly to form the laminated flexible circuit assembly, with the foldable element over the first flexible circuit sub-assembly with the sensor between the first flexible circuit sub-assembly and the second flexible circuit sub-assembly.

11. The method of claim 1, wherein one or more of the first flexible circuit sub-assembly and the second flexible circuit sub-assembly contain surface mounted components.

12. The method of claim 11, wherein the surface mounted components include an additional sensor.

13. The method of claim 12, wherein the additional sensor comprises one or more of: a strain gauge, a capacitive touch sensor, an accelerometer, a temperature sensor, and a humidity sensor.

14. The method of claim 11, wherein the surface mounted components include a light emitting diode (LED).

15. The method of claim 11, wherein the surface mounted components are encapsulated within a protective material.

16. The method of claim 1, further comprising adding an energy source to one or both of the first flexible circuit sub-assembly and the second flexible circuit sub-assembly.

17. The method of claim 16, wherein the energy source is a battery cell.

18. The method of claim 16, wherein the energy source is a rechargeable energy source which may be charged through one or more of: a solar cell, a conductive inductor pattern, and a vibration harvester.

19. The method of claim 1, further comprising encasing the computerized sensing apparatus within a protective cover material.

20. The method of claim 1, wherein the die-cut adhesive is thermally activated.

21. A flexible and attachable sensing apparatus comprising a flexible circuit assembly comprising:
    a first flexible circuit sub-assembly including a sensing area containing at least one flexible sensor electrically coupled to the first flexible circuit sub-assembly;
    a second flexible circuit sub-assembly bonded to the first flexible circuit sub-assembly using die-cut adhesive, such that the sensor is electrically coupled to the first flexible circuit sub-assembly and the second flexible circuit sub-assembly;

a component area containing non-flexible components to power and support the at least one flexible sensor;

the component area and the sensing area encased in a protective material to form a laminated flexible circuit assembly; and the sensing apparatus designed to be affixed non-invasively to a structure to be sensed and conform to a shape of the structure to which it is attached.

\* \* \* \* \*